United States Patent [19]

Steenblik et al.

[11] Patent Number: 5,461,495
[45] Date of Patent: Oct. 24, 1995

[54] APPARATUS FOR PROVIDING AUTOSTEREOSCOPIC AND DYNAMIC IMAGES AND METHOD OF MANUFACTURING SAME

[75] Inventors: Richard A. Steenblik, Atlanta; Mark J. Hurt, Alpharetta, both of Ga.

[73] Assignee: Applied Physics Research, L.P., Roswell, Ga.

[21] Appl. No.: 204,485

[22] Filed: Mar. 2, 1994

Related U.S. Application Data

[63] Continuation-in-part of Ser. No. 931,871, filed as PCT/US93/07784 Aug. 17, 1993, Pat. No. 5,359,454.

[51] Int. Cl.$^6$ ............................ G02B 27/22; G02B 27/12
[52] U.S. Cl. ............................. 359/463; 359/619
[58] Field of Search ...................... 359/462, 463, 359/567, 619, 893, 894, 620, 3, 8

[56] References Cited

U.S. PATENT DOCUMENTS

| | | | |
|---|---|---|---|
| 1,260,682 | 3/1918 | Kanolt | 352/46 |
| 1,918,705 | 7/1993 | Ives | 359/463 |
| 3,161,509 | 12/1964 | Howe et al. | 359/463 |
| 3,241,429 | 3/1966 | Rice | 359/620 |
| 3,306,974 | 2/1967 | Cunnally | 178/5.2 |
| 3,357,770 | 12/1967 | Clay | 359/463 |
| 3,365,350 | 1/1968 | Cahn | 359/463 |
| 3,459,111 | 8/1969 | Cooper, Jr. | 359/463 |
| 3,607,273 | 9/1971 | Kinney | |
| 3,706,486 | 12/1972 | de Montebello | 359/619 |
| 3,953,869 | 4/1976 | Wah Lo et al. | 354/115 |
| 4,120,562 | 10/1978 | Lo et al. | 350/130 |
| 4,158,501 | 6/1979 | Smith et al. | 355/77 |
| 4,468,115 | 8/1984 | Lao | 355/22 |
| 4,572,611 | 2/1986 | Bellman | 359/900 |
| 4,596,458 | 6/1986 | Gundlach | 355/22 |
| 4,600,297 | 7/1986 | Winnek | 355/22 |
| 4,667,092 | 5/1987 | Ishihara | 359/619 |
| 4,674,853 | 6/1987 | Street | 354/112 |
| 4,853,769 | 8/1989 | Kollin | 358/88 |
| 4,903,069 | 2/1990 | Lam | 355/22 |
| 4,920,039 | 3/1990 | Fotland et al. | 430/324 |
| 5,113,213 | 5/1992 | Sandor et al. | 355/22 |
| 5,132,839 | 7/1992 | Travis | 359/463 |

OTHER PUBLICATIONS

Takanori Okoshi, Three–Dimensional Imaging Techniques, 1976, New York, pp. 13–28 and 366–368.
Herbert E. Ives, The Chromolinoscope Revived, Jun. 1930, New York, pp. 345–347.

Primary Examiner—Scott J. Sugarman
Assistant Examiner—Ricky Mack
Attorney, Agent, or Firm—Deveau, Colton & Marquis

[57] ABSTRACT

A light control material for providing autostereoscopic and dynamic images. The light control material is comprised of a light direction control optic which contains a pattern of bright zones and dark zones which provide light direction control, and a light focusing optic which contains a plurality of gradient refractive index lenses which provide light focusing control. The bright zones and dark zones and the gradient refractive index lenses are preferably formed in a single polymer layer. Interleaved image elements may generally be located anywhere between the light control optic and an observer. The light direction control optic in conjunction with the light focusing optic and the interleaved image elements produce the perception autostereoscopic depth, motion, or color change.

27 Claims, 11 Drawing Sheets

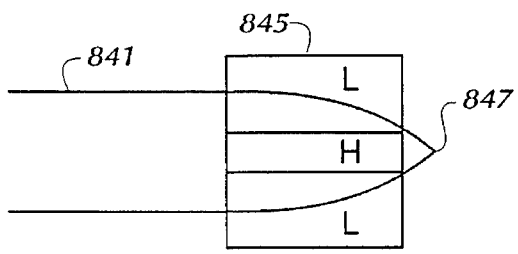
FIG. 19
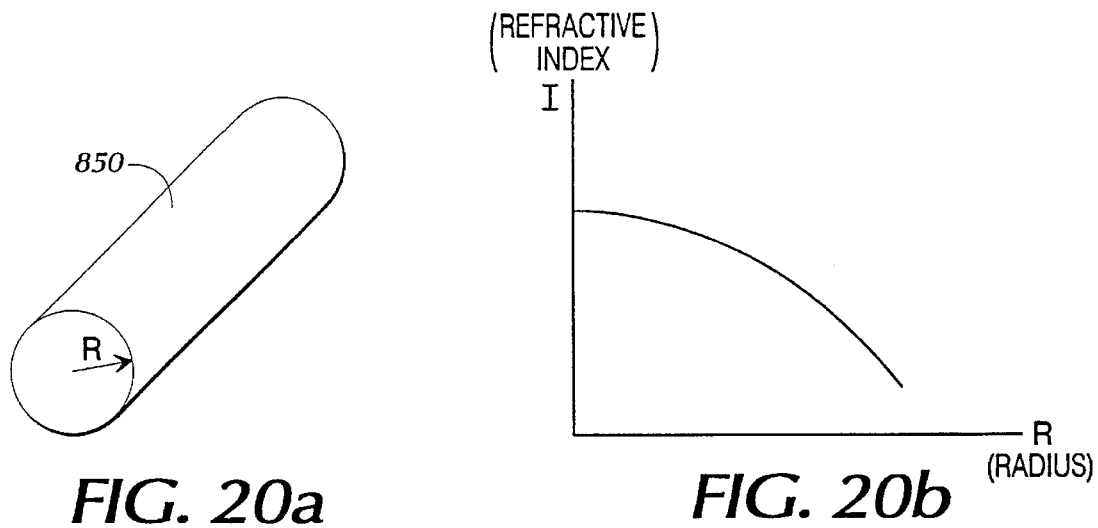
FIG. 20a
FIG. 20b
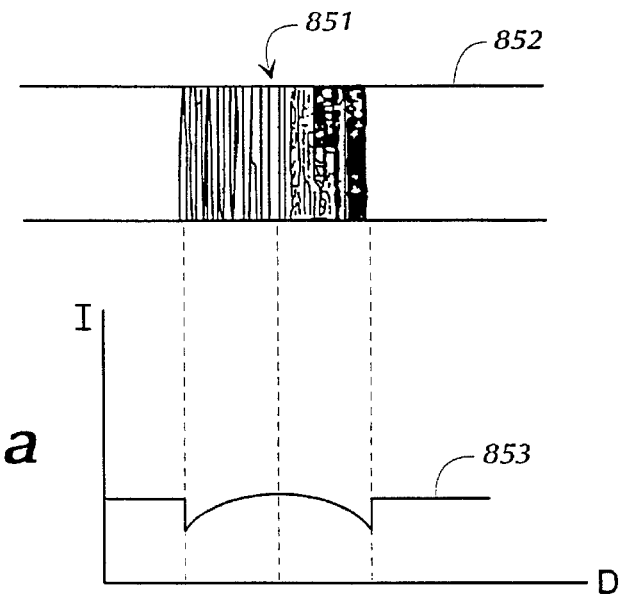
FIG. 21a

APPARATUS FOR PROVIDING AUTOSTEREOSCOPIC AND DYNAMIC IMAGES AND METHOD OF MANUFACTURING SAME

This application is a continuation-in-part of a currently pending International application having International Application No. PCT/US93/07784, filed Aug. 17, 1993, entitled "Apparatus for Providing Autostereoscopic and Dynamic Images and Method of Manufacturing Same", which is a continuation-in-part of a currently pending U.S. application having application Ser. No. 07/931,871, filed Aug. 18, 1992, now U.S. Pat. No. 5,359,454 entitled "Apparatus for Providing Autostereoscopic and Dynamic Images".

TECHNICAL FIELD

The present invention relates to the production and display of autostereoscopic and dynamic images, and more particularly to a technique for producing autostereoscopic and dynamic images in thin-film material.

BACKGROUND OF THE INVENTION

Currently, image display methods which enable the presentation of multiple images from different viewing angles fall into three broad categories: projection-type (non-holographic) displays, lens-sheet displays and holographic displays. Any of these methods can be used to display autostereoscopic depth images, motion images and color changing images.

The most common technique of producing projection-type displays is the barrier strip method. A barrier strip display device consists of an interleaved image which typically consists of strips taken from each of the images that are to be displayed. The strips comprising each of the images are interleaved parallel to each other so that every Nth strip is from the same image, where N is the number of images. This number may be as small as two or as large as nineteen or more. The interleaved image is disposed in close proximity to and parallel to a viewing mask. The viewing mask contains parallel opaque lines of equal width which are separated by transparent zones having a uniform width which is equal to or less than that of the opaque lines. Barrier strip images are usually viewed from the mask side by means of light transmitted through the interleaved image and the mask. The intensity of the back illumination required depends on the brightness of the viewing environment and on the number of images which are interleaved. The color that is perceived at a particular point and at a particular viewing angle with a barrier strip display device is determined by the color of the image strip which is visible through the mask at that point.

Though barrier strips are capable of displaying autostereoscopic images, a barrier strip display device will produce this effect only when certain conditions are satisfied. First, the mask lines must lie in a plane orthogonal to that of the observer's eyes. Also, the width and spacing of the transparent mask lines and the distance from the interleaved image to the mask must be such that each of the viewer's eyes sees different, non-overlapping regions of the interleaved image through the transparent mask lines. The interleaved image must have been constructed such that each of the image lines visible to the right eye is part of a right eye stereo pair image, and the image lines visible to the left eye are each part of a matching left eye stereo pair image. The distances and positions at which stereoscopic depth is perceived is restricted by the geometry of the mark, the number of interleaved images and the mask-to-image distance.

In addition to the difficulty in achieving an autostereoscopic effect, a significant limitation on barrier strip image devices is that the thickness of such a device is governed by the number of images it presents, the width of the image strips and the intended viewing distance. The distance between the barrier strips mask and the interleaved image is generally a large multiple of the width of a single image strip. A typical barrier strip device has a thickness of about six (6) millimeters, making it an unacceptable technology for mass production. The barrier strip method is further limited in that it is only useful as a back-illuminated image display method.

Among the most common lens-sheet display techniques are integral photography, integrams and lenticular sheets. Integral photography (referred to in the trade as the "fly-eye" approach) involves photographing an image through a plastic sheet into which small fly's-eye lenses (typically 50,000 lenses per sheet) have been impressed. The lenses cause a complete reproduction of the photographed image to be reproduced behind each tiny lens. This approach can recreate a visually complete three-dimensional image, but can only be reproduced at great expense. A further limitation of this lens sheet is that the images are at such a fine resolution that they cannot be reproduced on printing presses, but have to be reproduced photographically. Images produced by this method also have a very restricted viewing angle within which the image reconstructs correctly.

The integram approach to lens-sheet displays is a complex extension of the fly-eye approach. It involves positioning the captured image along a precisely curved surface (dimensionally matching the focal surface of the fly-eye lens) to overcome the viewing angle restrictions. The expense and difficulty in producing high quality three-dimensional images with this method, however, have prevented any large scale commercial success.

A third method of the lens-sheet display technique currently known is the lenticular screen display device. A lenticular screen display device employs an array of cylindrical lenses to control the viewing angle of interleaved image strip. The lenses are disposed parallel to the image strips between the observer and the image strips such that the image strips directly underneath a lens lies at or near the lens' focal plane. The range of angles through which the image will be visible is determined by the position of each image strip underneath the lens array. As with the barrier strip method, the color of the image strip determines the color that will be perceived at the point of the lenticular screen processed image.

As with the barrier strip method, a significant limitation on the lenticular screen display device is that its thickness is dependent on the width of the image strips. The thickness also is limited by the number of images presented, the designed viewing distance, and the focal properties of the lens. The thickness of these devices is in general greater than the width of the image strip multiplied by the number of images. As a result, a typical lenticular screen display device has a thickness of about one (1) millimeter, making it relatively expensive for mass production, and generally too thick for automated printing press equipment.

The third broad category of currently known methods of producing and displaying autostereoscopic images is holographic displays. Holographic displays use holograms to reconstruct the appearance of an object over an angular range of view without the use of a lens. A hologram is a record of a diffraction pattern representing an object as viewed from a certain range of positions. There are many types of holograms, each of which possesses its own range of viewing conditions. Some holograms require laser illumination for the reconstruction of an image, while others can be viewed by means of incoherent white light. Holograms displaying full color over a range of viewing angles normally require illumination by three lasers— red, blue and green—simultaneously. White light viewable holograms are generally either monochromatic or display a rainbow coloration which varies according to the viewing angle. Holograms are capable of displaying autostereoscopic, motion, combined autostereoscopic and motion, and color-change images. However, creating and reproducing a high quality hologram is a time-consuming and difficult process. Holograms cannot be created by printing and are not easily combined with the mass production of printed articles. Holograms are expensive and difficult to originate. They also require special equipment to impress onto a printing substrate. Because of their restrictive viewing conditions and limited control of color, the practical applications of holographic displays is very limited.

Until the present invention, no one has developed a device for providing printed autostereoscopic and dynamic images on thin-films (e.g., those with the approximate thickness of conventional paper). Due to their thickness limitations, neither the barrier strip devices nor the lenticular screen devices are amenable to the production of thin- film images. This has prevented the widespread application of these devices because conventional printing presses are designed to handle paper and paper-like materials. The thickness of barrier strips and lenticular screen display devices also makes them inherently stiff, further limiting their mass production potential. These devices are further limited in application because of the inherent inflexibility in the location of the printing within their structure. The print must be at the focus of the lenticular screen or be on the opposite side of the substrate from the barrier strips. It is not possible to print on top of the lenticular screen nor on top of the barrier strip surface and still retain the ability to display the desired set of multiple images.

SUMMARY OF THE INVENTION

In a preferred embodiment, the present invention comprises a pattern of bright zones and dark zones, a plurality of gradient refractive index lenses, and a transparent substrate. The pattern of bright zones and dark zones provides light direction control. The gradient refractive index lenses provide light focusing control. The pattern of bright zones and dark zones and the gradient refractive index lenses are comprised in a single embossed layer of photopolymer. The embossment is bonded to a transparent substrate which provides mechanical stability. Interleaved image strips may generally be located anywhere between the embossed layer of photopolymer, and the observer. The gradient refractive index lenses, also referred to as the focusing optics, in conjunction with the inner optic and the interleaved image strips create the perception of autostereoscopic depth, motion, or color change.

One of the main advantages of incorporating the bright zones and dark zones, also referred to as the light direction control optics and the focusing optics into a single embossment is that difficulties in meeting scale requirements for the light direction control optics and the focusing optics are substantially eliminated. Another advantage of incorporating the light direction control optics and the focusing optics into a single embossment is that once the device has been fabricated it is essentially a non-copyable, or counterfeit proof, device.

A further advantage of the single embossment autostereoscopic device of the present invention is the ease with which the device may be incorporated into existing packaging structures. Since the upper surfaces of the embossment and the transparent substrate are flat, they can easily be prepared to accept ink. Conventional packaging structures normally have the print contained on a substrate which is buried between several other layers of various materials. The device of the present invention may be easily incorporated into such conventional packaging structures and the print may be carried on the surface of the transparent substrate. Furthermore, the under surface of the light direction control optics is preferably coated with a reflective layer of metal, such as aluminum, which may serve as an oxygen and moisture barrier in conventional packaging structures, such as potato chip bags.

Yet another advantage of the single embossment autostereoscopic device is that one master may be fabricated which contains the light direction control optics pattern and the focusing optics pattern and embossments can be generated therefrom. This facilitates mass production of the single embossment autostereoscopic device and enhances the preciseness with which it can be produced.

Accordingly, it is an object of the present invention to provide a single embossment autostereoscopic device which eliminates difficulties with scale requirements.

It is another object of the present invention to provide an autostereoscopic device which is non-copyable, or counterfeit proof.

It is yet another object of the present invention to provide an autostereoscopic display device which may easily be incorporated into conventional packaging structures.

It is a further object of the present invention to provide a method for fabricating a single embossment autostereoscopic device which displays autostereoscopic depth, motion, or color change.

It is yet another object of the present invention to provide means for controlling the field of view of autostereoscopic or dynamic images.

It is also an object of the present invention to provide a method for producing autostereoscopic images in thin film materials.

It is a further object of the present invention to provide a method for printing thin film autostereoscopic images.

It is yet another object of the present invention to provide a method for producing engineered light control films.

It is still another object of the present invention to provide a method for increasing the brightness of printed images.

A further object of the present invention is to provide a method for producing thin film images which display motion.

It is a final object of the present invention to provide a method for producing thin film images which display color changes when viewed from different angles.

BRIEF DESCRIPTION OF THE DRAWINGS

FIG. 19 illustrates the general concept of a gradient refractive index lens.

FIGS. 20a and 20b illustrate a known method for creating a gradient refractive index lens.

FIG. 21a is a cross-sectional view of the gradient refractive index lens of the present invention.

DETAILED DESCRIPTION

Figure 1:
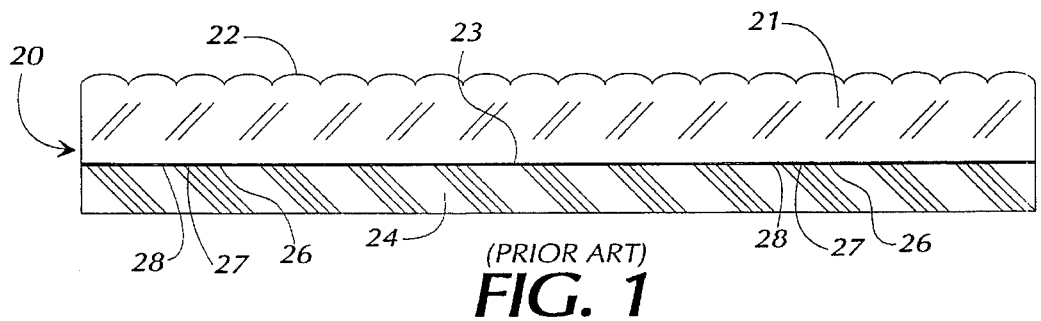
FIG. 1 is a cross-sectional view of a prior-art conventional lenticular screen structure.

Referring now in detail to the drawing figures, in which like reference numerals represent like parts throughout the several figures, FIG. 1 shows a conventional lenticular screen display device 20, which consists of a layer of optical material 21 bearing an array of cylindrical lenses 22 on its upper surface and an image 23 in contact with its lower surface. The image 23 is generally supported upon a substrate 24. The image 23 is typically created by interleaving image strips from a multiplicity of images. If, for example, three images are used, then image 23 would consist of right, center, and left image strips 26, 27 and 28.

Light reflecting from each image strip 26 is directed by the lenses 22 toward the observer's right eye. By virtue of their different positions underneath the lens array 22, the light reflected from the center image strips 27 is directed by the lenses 22 in a slightly different direction than that of the right image strips. Light from these strips may be intercepted by the observer's left eye. In the case of an autostereoscopic image, the observer would be viewing a stereo pair, different images with each eye, and would thus perceive a stereoscopic image. Light reflecting from the left image strip is similarly directed in a third direction. If the observer's position changes such that the center image is intercepted by the right eye and the left image is intercepted by the left eye, a slightly different view of the autostereoscopic scene will be perceived, since right and center images comprise a stereo pair, and center and left comprise a stereo pair.

Figure 2A:
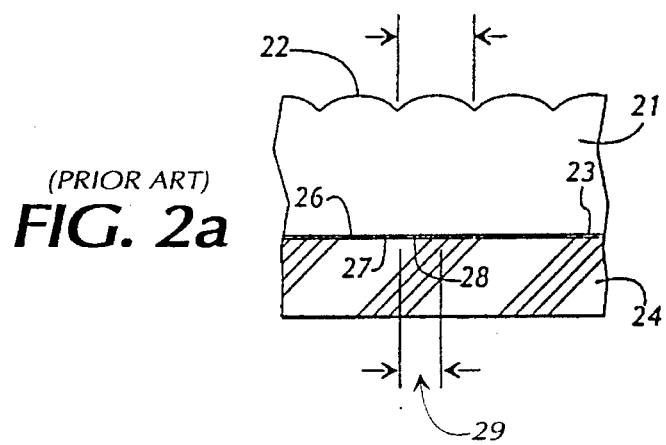
FIGS. 2a–2b are comparison scale drawings illustrating the thickness of a conventional lenticular screen structure and that of the present invention.

The width of the individual lenses in the conventional lenticular screen method must be some multiple, n, of the image strip width, where n is an integer. Because of the limitations of the focusing optics 22, the thickness of the lens in a lenticular screen display device will also be some multiple of the print strip width 29, as shown in FIG. 2a. The minimum strip width of printed images is set by the smallest shape which can be reliably printed, which will generally be the size of a single print dot. Printing presses vary in their printing resolution, but a commercial printing press rarely exceeds a printing resolution of 175 lines/inch, or a print dot spacing of about six thousandths of an inch (152 microns). As a result, the width and thickness of a conventional lenticular screen device 20 can never be less and is typically much larger than the dimensions of the print dot spacing.

Figure 2B:
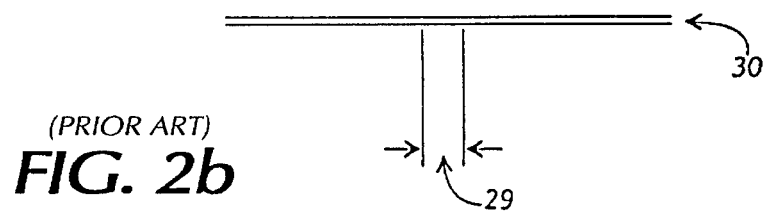

The present invention circumvents this size limitation. The thickness of the present invention is independent of the print dot spacing and the size of the print. FIG. 2B illustrates the relative thickness of the present invention 30 for the same print width 29. FIGS. 2A and 2B are drawn to the same scale to show the magnitude of the difference between the thickness of a conventional lenticular screen device and that of the present invention for the same print width. The optical thickness of the present invention for images printed at 175 lines/inch would typically fall in the range of from 1–3 mils, compared with 17 to 50 mils for a conventional lenticular screen device.

Figure 3A:
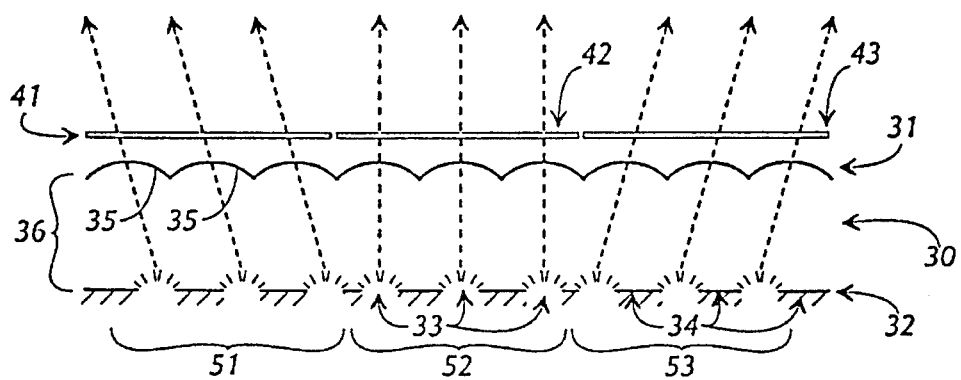
FIG. 3a is a cross-sectional view of a first embodiment according to the present invention including three image elements.

Referring now to FIG. 3a, the basic operation of the present invention will be described. The light control material 30 comprises a two-layer optical system separated by a refractive material 36. It is the two-layer optical system that allows the thickness of the device to be independent of the print size. In one embodiment of the present invention, the first layer comprises focusing optics 31 and is sometimes referred to as the "outer optic" (i.e., closest to the observer). The focusing optics 31 generally consist of an array of lens elements 35. The second layer contains light control optics 32 and is sometimes referred to as the "inner optic". The layer of light control optics 32 consists of a pattern of bright zones 33 disposed generally parallel to the axial direction of the focusing elements 35. The bright zones 33 are separated from each other by dark zones 34, which may be either light absorbing or light dispersing. The composition of the focusing optics 31 and the light control optics 32 will be discussed in detail below.

FIG. 3a also illustrates the cooperation of the focusing optics 31 and the light control optics 32 for light directional control. In FIG. 3a the light source (not shown) is located underneath the light control optics 32, and the light control material 30 is operating in a light transmissive mode. Three image elements (left image element 41, center image element 42, and right image element 43) are placed above the focusing optics 31. While FIG. 3a shows three image elements, the present invention is not limited to that number of image sets. The device will operate with as few as two sets of image elements (e.g., up/down or left/right) or with many more than that. Some applications which are not brightness sensitive could tolerate (and benefit from) a large number of image sets, such as four, five, or more. The relative positions of the image elements 41–43 and the focusing optics also is not important. The light directional control function may be performed with the image elements 41–43 placed either above the focusing optics 31 as shown in FIG. 3a, in between the focusing optics 31 and the light control optics 32, or below the light control optics 32.

Assuming the device is operating with three sets of image elements, the light control material is divided into three image zones—a left image zone 51, a center image zone 52 and a right image zone 53. The center image zone 52 is formed by positioning the associated bright zones 33 directly below the center of the lens elements 35. Light passing through the center image zone 52 will be directed through the focusing optics 31 above it and transmitted through the center image element 42 as center directed light (this light may be intercepted by the observer's right eye). The left image zone 51 is formed by laterally shifting the position of the associated bright zones 33 to the right so that the center of the bright zones are no longer aligned with the center of the lens elements 35. Light passing through the left image zone 51 will then be directed through the left image element 41 and transmitted as left directed light (this light may be intercepted by the observer's left eye, forming a stereo pair with the center image zone light directed to the right eye). The right image zone 53 is similarly formed by laterally shifting the associated bright zones 33 to the left. Light passing through the right image zone 53 will be directed through the right element 43 and transmitted as right directed light (if the observer's position shifts so that the center image light is intercepted by the observer's left eye, then the right directed light may be intercepted by the observer's right eye, forming a stereo pair).

The image elements 41–43 can be composed of transparent, colored print dots that serve to color the light but will not control the directions of visibility of the lenses depicted. The resulting system therefore enables an observer to perceive one set of image elements from one eye and a different set of image elements from the other eye, thereby creating the perception of autostereoscopic depth, motion or color change.

FIG. 3a shows three sets of lenses 35 for each image element for simplicity. However, the present invention need not be limited to this number. The number of lenses that are spanned by each image element will be a design variable, depending on the printing resolution, the width of the image elements, and the size of the lenses. The actual number of lenses devoted to a single image element can range from one lens to more than twenty. A typical number will be six to nine lenses per image element. The image elements do not necessarily have to cover the entire surface of the light control material. In general, each image element need only lie over its respective image zone, but the image elements do not have to be in perfect registration with the image zones. Also, the spacing between the image elements is not critical. Each image element does not have to be equally spaced from the edge of its respective image zone.

Figure 3B:
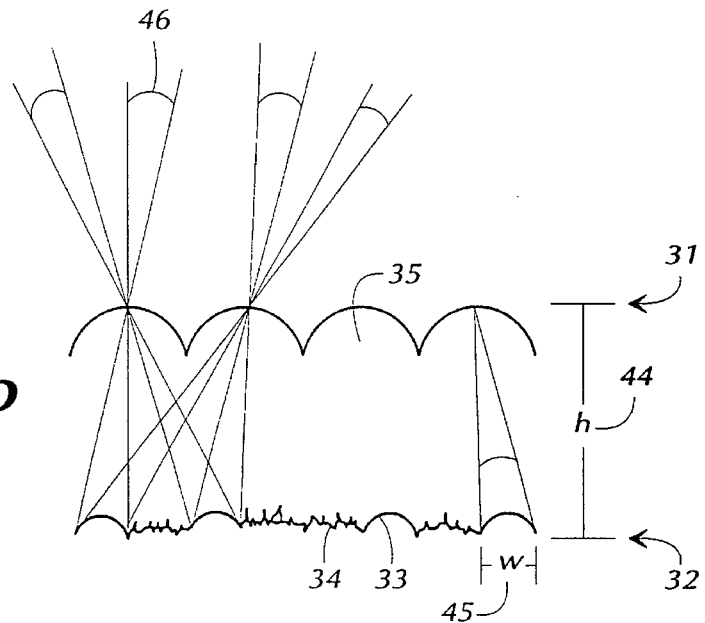
FIG. 3b illustrates an alternative embodiment of the light/control optics of the present invention.

FIG. 3b illustrates how the present invention enables the field of view (F.O.V.) to be adjusted without altering the distance between the light control optics 32 and the focusing optics 31. The field of view 46 corresponds to the area over which an observer will see a particular image element. With the light control material 30, FIG. 3a, the field of view can be adjusted by selectively altering the distance between the inner and outer optics and by correspondingly adjusting the focal length of the outer optic. As indicated in FIG. 3b the field of view 46 is related to the distance 44 between the inner and outer optics and the width of the bright zones 45. The relationship is described by the equation F.O.V.=arc tan (w/h). If the widths of the bright zones 45 in FIG. 3b are decreased, the fields of view 46 become narrower. However, merely decreasing the widths of the bright zones will distort the interlacing of the images with respect to the observer. Furthermore, merely decreasing the width of the bright zones will decrease the amount of brightness coming from the light control optics 110, thereby decreasing the brightness of the image. Increasing the width of the bright zones will expand the fields of view but it will also distort the interlacing of the images with respect to the observer.

Figure 3C:
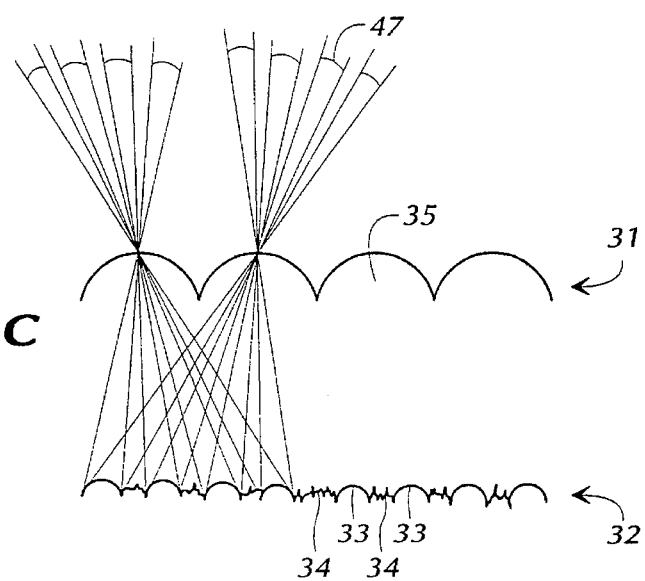
FIG. 3c illustrates how the field of view is controlled.

FIG. 3c illustrates how the fields of view can be controlled without decreasing the amount of light coming from the light control optics and without distorting the interlacing of the image. In the embodiments of FIGS. 3b and 3c, two sets of image elements (not shown) are utilized to obtain the autostereoscopic image. By decreasing the widths of the bright zones 33, the fields of view 47 are narrowed. However, the amount of light coming from the inner optic 32 has not decreased since there are two bright zones 33 under each lens 35, the sum of the areas of which equals the area of one of the bright zones 33 shown in FIG. 3b. Also, the alternating pattern of the bright and dark zones in the inner optic shown in FIG. 3c maintains the interlacing of the images with respect to the observer.

Therefore, by having multiple bright zones with respect to each lens, the field of view can be controlled while maintaining the brightness and interlacing of the images. Furthermore, the field of view can be controlled in this manner regardless of the number of sets of image elements utilized to create the autostereoscopic image. However, the pattern of the bright and dark zones in the inner optic will vary depending on the number of sets of image elements used to create the autostereoscopic image. The period of the light control optics, as indicated by the pattern of bright zones and dark zones, changes from one image strip to the next (i.e., in accordance with the interleaving of the image strips). Although FIG. 3c illustrates two bright zones for each lens, the present invention is not limited to a particular number of bright zones and dark zones for each lens. Furthermore, the bright zones can be transmissive or reflective, although the preferred embodiment of the invention utilizes bright zones which are reflective.

The light control optics shown in FIGS. 3b and 3c represent a preferred embodiment of the present invention for the bright zones and dark zones. Cylindrical reflectors can be used to create the bright zones. By using cylindrical reflectors, light is reflected from the light control optics through a wide range of viewing angles. The light reflected from the light control optic avoids any specular reflection off of the surface of the image, thereby avoiding glare and enhancing the brightness of the image. Other arcuate reflectors, such as domes or ellipses, can also be used in the light control optics. When ellipses are used, an even wider range of viewing angles is realized. However, the intensity of the light reflected from the inner optics will be somewhat less when ellipses rather than cylinders are used as the bright zones.

The shape of the reflector used in the light control optic is selected in accordance with the range of viewing angles over which the brightness of the image is intended to be enhanced. Also, inverted dome-shaped (i.e., dish-shaped) reflectors can be used in the light control optic instead of dome-shaped reflectors. The effect of using dome-shaped or inverted dome-shaped reflectors is essentially the same, i.e., both enhance the brightness of an image over a particular range of viewing angles. The bright zones will be arcuate in shape regardless of whether the light control optic is operating in a transmissive or reflective mode. The light control optic will be coated with a reflective layer of metal when it is operating in the reflective mode. When operating in the transmissive mode, the bright zones will not be coated with a reflective layer of metal. The light control optic will be discussed in greater detail below.

The dark zones 34 are preferably comprised of a field of tapered elements. The tapered elements are formed by using reactive ion etching with oxygen as the reactive gas to create a non-uniform etch in a photopolymer. The result is a light trap comprised of stalagtite shaped structures which have large height-to-width ratios. The light traps will be described in detail below with respect to FIGS. 13a–13b.

Figure 4:
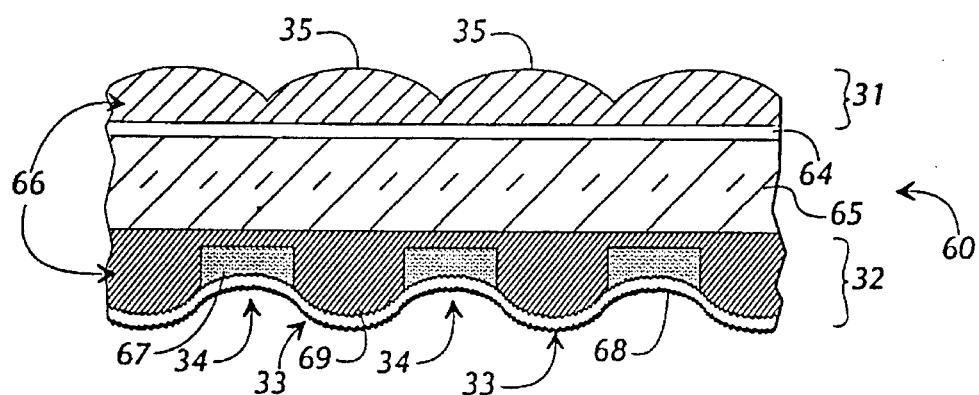
FIG. 4 is a cross-sectional view of the first embodiment of the present invention.

While FIG. 4 shows the bright 33 zones in the center image zone 32 aligned directly beneath the center of the associated lens elements 35, this alignment is not critical to the performance of the invention. The actual position of the lens elements over the light control optics is not important. What is important is the pattern of the light control optics 32. The spacing of the bright zones is periodic in each image zone so that the period of the bright zones matches the period of the lens elements. As long as the lateral spacing of the light control optics is fixed and the lateral positioning of the focusing optics is fixed, the relative positions of the two layers is not important. This allows "slip" in the operation of the device and thus makes it easier to manufacture.

Viewed from above without any image elements, an observer looking at the light control material would see a set of very fine bright strips separated by very fine black strips. The relative width of the bright strips would depend on the pattern of the light control optics. With one eye, an observer would see one set of strips that are bright. The other eye would see a different set of strips that are bright. The set of strips that appear bright with the left eye will appear dark with the right eye, and vice versa. When the image elements are imposed onto the light control material, the observer is able to see one image element set with one eye and another image element set with the other eye, thus creating the perception of autostereoscopic depth, motion or color change.

Referring now to FIG. 4, the details of the focusing and light control optics will be explained. The focusing optics 31 consists of an array of refractive cylindrical lenses 35. Alternatively, the focusing optics may consist of diffractive lenses, hybrid refractive/diffractive cylindrical lenses, or reflective focusing troughs of conventional geometry, diffractive form or hybrid form. These lenses 35 will generally be made from a photopolymer 66 or other photo-initiated acrylated epoxies. A preferred method for producing the focusing optics is by "soft" embossing the photopolymer 66 onto an optical substrate 65, i.e., casting the liquid plastic against a roller that has the desired geometry and allowing it to cure. While "soft embossing" is preferred, other methods may be used to produce the focusing optics. For example, "hard" embossing, i.e., impressing a soft, but not liquid, plastic against a roller that has the desired pattern, can also be used to obtain the same desired effect. Additional methods suitable for producing the focusing optics include injection molding, compression molding, extrusion, and casting. The soft embossing technique is preferred because it generally enables higher precision replication than hard embossing and it also reduces the amount of tool wear. The width of the individual lenses 35 in the focusing optics 31 is very small, generally falling in the range from 8 to 25 microns.

FIG. 4 is a small enlarged section of the light control material of the present invention, showing a single image element 64 positioned between the focusing optics 31 and the light control optics 32. As noted above, however, the invention also will produce the desired effects if the positions of the image element 64 and focusing optics 31 are reversed.

The photopolymer 66 is embossed onto a transparent optical substrate 65. This substrate will preferably be a polyester material, but other commercial plastic film materials such as polypropylene can also be used.

The second layer of the light control material 30 contains light control optics 32. The light control optics 32 are designed to provide directional control of the light passing out through the focusing optics 31 to the observer. The layer of light control optics 32 consists of a pattern of bright zones 33 separated from each other by dark zones 34. In one embodiment, the distance from one edge of one bright zone 33 to the corresponding edge of the next bright zone is the same as the width of one lens above it. In another embodiment, the dark zones 34 are formed by applying an opaque material 67 onto those areas of a reflective surface 68 that are to absorb incident light. The opaque material 67 preferably comprises pigmented ink, but any light absorbing optical structure or light dispersing optical structure can also be used. Those zones of the reflective surface 68 not covered by the opaque material 67 form the bright zones 33 of the light control optics. Optionally, those areas that are to be bright zones 33 can also be formed by applying a diffractive, holographic, or diffusing pattern 69 on the bright zones of the light control optics. The reflective surface 68 conforms to diffractive, holographic, or diffusing pattern 69. The addition of a diffractive pattern 69 to the surface 68 serves to enhance the brightness of the bright zones 33 at chosen viewing angles. The light control optics 32 may be embossed with the same photopolymer 66 that is used to emboss the focusing optics 31. Layer 68 consists of a layer of highly reflective metal, preferably aluminum.

In the embodiment of FIG. 4, the light source (not shown) is above the focusing optics 31, and the invention will operate in a light reflective mode as compared to the light transmissive mode of the embodiment shown in FIG. 3a.

Figure 5:
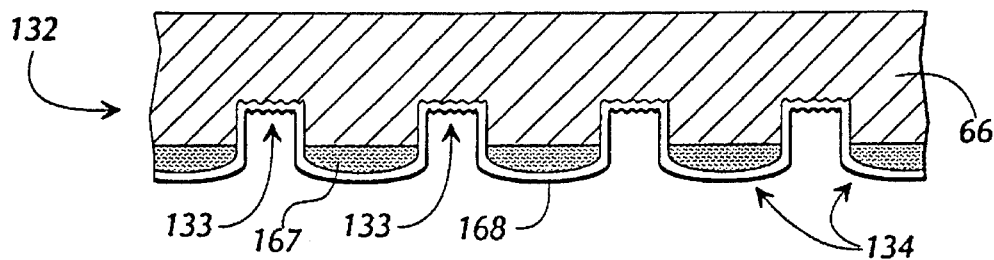
FIG. 5 shows a first alternative embodiment of the light control optics of the present invention.
Figure 6:
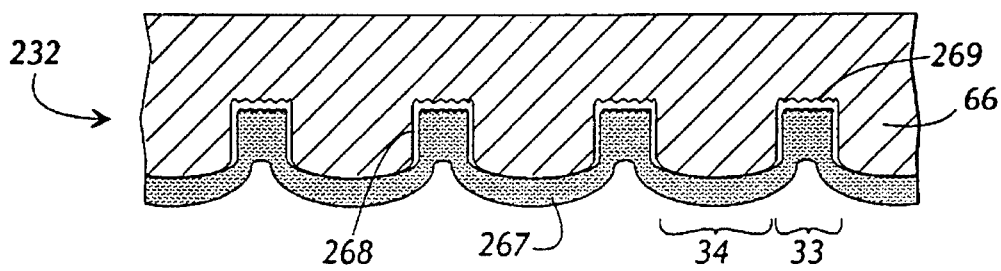
FIG. 6 shows a second alternative embodiment of the light control optics of the present invention.
Figure 7:
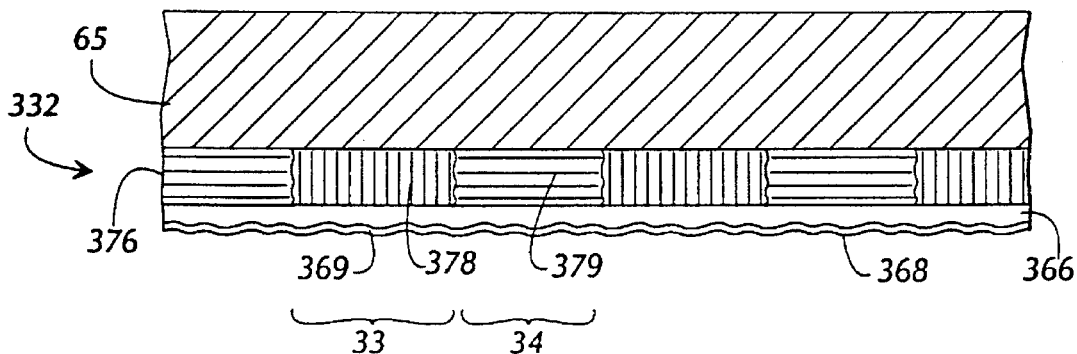
FIG. 7 shows a third alternative embodiment of the light control optics of the present invention.

While FIG. 4 shows one embodiment of the invention, there are numerous alternative ways of designing the light control optics, as shown in FIGS. 5–7. FIG. 5 shows an alternative design in which the geometric pattern of the light control optics 132 is the reverse of that shown in FIG. 4. In other words, the bright zones in this embodiment are located in those areas where the dark zones were located in the first embodiment. In this embodiment, the dark zones 134 are formed in the recessed notches created in the reflective substrate 168 with an opaque material 167 and the bright zones 133 are formed between. The relative positions of the dark zones and the bright zones along the light control optics are reversed from that of the embodiment shown in FIG. 4. In the embodiment of FIG. 5, the present invention will function in a light reflective mode due to the presence of the reflective layer 168.

FIG. 6 shows a second alternative design for the light control optics 232. In this design, the opaque material 267 is in effect the substrate. The bright zones 233 are shown with a reflective layer 268, preferably of aluminum, and a diffractive pattern 269. The bright zones 233 here are formed by covering selected portions of the opaque substrate with reflective layers 268.

FIG. 7 shows a third alternative design for the light control optics. In this embodiment, the light control optics 332 consist of a photographic emulsion layer 376. The bright zones are formed as transparent emulsion zones 378, and the dark zones are formed as opaque emulsions zones 379. A transparent material 366 (preferably a photopolymer) is layered below the photographic emulsion layer 376. Below the transparent material 366, a reflective layer 368 is applied to the diffractive pattern 369 so that the device will function as a reflective material.

Figure 8:
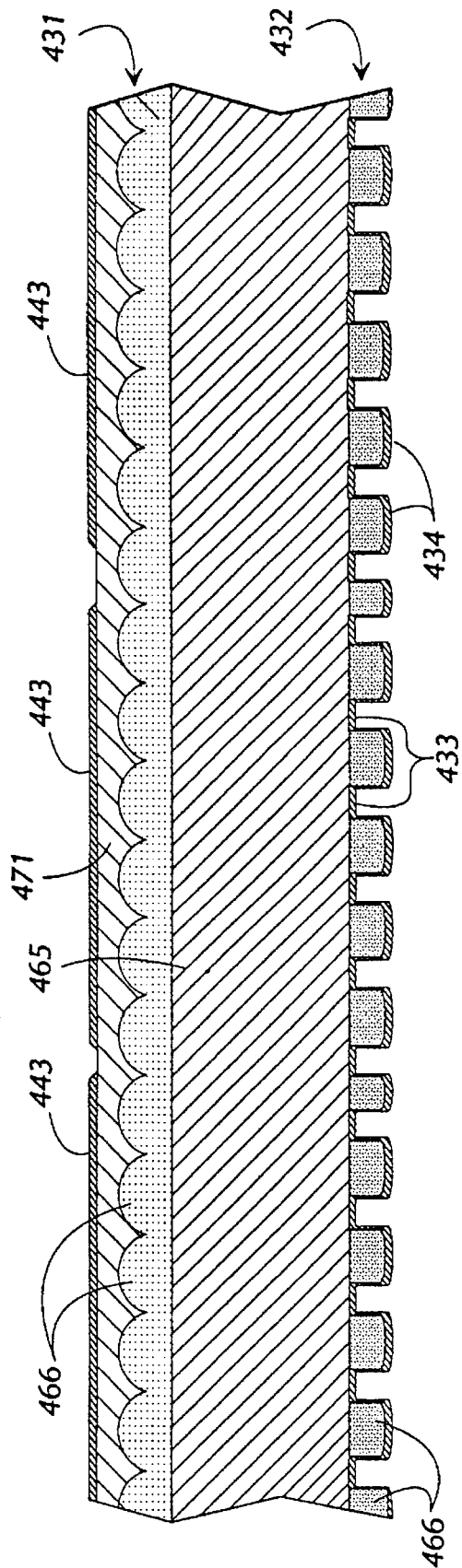
FIG. 8 is a cross-sectional view of another alternative embodiment of the present invention.

FIG. 8 shows another embodiment of the invention in which focusing optics 431 with a high refractive index are embedded in a low refractive index layer 471. Image elements 443 are located on top of layer 471. An inner optic 432 comprised of bright zones 433 and dark zones 434 is also provided. The focusing optics 431 will preferably be made from a photopolymer 466 with a refractive index of up to about 1.55, but other photopolymers with refractive indexes of about 1.6 can also be used. The low refractive index layer 471 will preferably consist of a polymer. The polymer does not necessarily have to be a photopolymer, but one could be used if it had a low enough refractive index. It is desirable that the polymer have as low a refractive index as possible in order to counterbalance the high refractive index of the focusing optics 431. Examples of polymers that can be used for the low refractive index layer 471 (and their respective refractive index) are polytetrafluoroethylene (PTFE, "Teflon")(1.35), fluorinated ethylene propylene (FEP)(1.34), polyvinylidene fluoride (PVDF)(1.42), and polytrifluorochloroethylene (PTFCE)(1.43). The function of the low refractive index layer 471 is to make the surface of the light control material smooth, thereby making the device more amenable for printing. The low refractive index layer may be formed by, for example, a melt process allowing the polymer to be applied as a liquid and to be self-leveling. The low refractive index layer 471 may also be used as an adhesive between the high refractive index lenses 431 and a polymer film having better printing characteristics. The focusing optics 431 are designed with a particular radius of curvature depending on the refractive index of the polymer. The lower the refractive index of the polymer 471, the lower the curvature of the lenses. The closer the refractive index of the polymer 471 approaches the refractive index of the photopolymer 466, the more curved the lenses have to be. The higher the refractive index of the photopolymer 466, the thinner the light control material. The greater the difference between the refractive indices, the shorter the focal length of the lenses. The smaller the difference, the longer the focal length of the lenses. Preferably, the difference between the refractive indices is on the order of 0.1 or greater.

The photopolymer 466 is embossed onto an optical substrate 465, consisting of a commercial plastic film such as polyester. In this embodiment, the refractive index of the optical substrate 465 is not critical. A change in the refractive index of the optical substrate 465 is easily compensated for by changing the thickness of the plastic film material. In general, the higher the refractive index of the optical substrate, the thicker the film material required. Photopolymer 466 is also used to fill the dark zones of the inner optic 432. For this purpose photopolymer 466 carries an opaque pigment.

Figure 9:
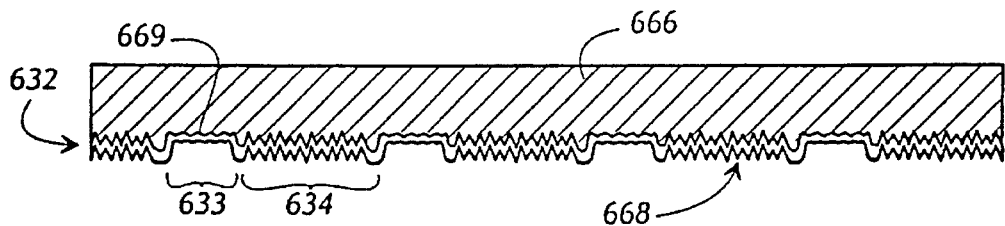
FIG. 9 is a cross-sectional view of a further alternative embodiment of the present invention.

FIG. 9 shows a further alternative embodiment for the light control optics 632 of the present invention. In this embodiment, the substrate is formed of a reflective layer 668 which comprises both bright zones 633 and dark zones 634. The bright zones have a diffractive pattern 669. The dark zones are formed of fields of tapered elements. In their preferred form the tapered elements in the dark zones have an aspect ratio of their height being 4 times their width or greater. In this manner, light entering the dark zones does not reflect back out of the dark zones. A photopolymer 666 as previously described covers the substrate.

Figure 10:
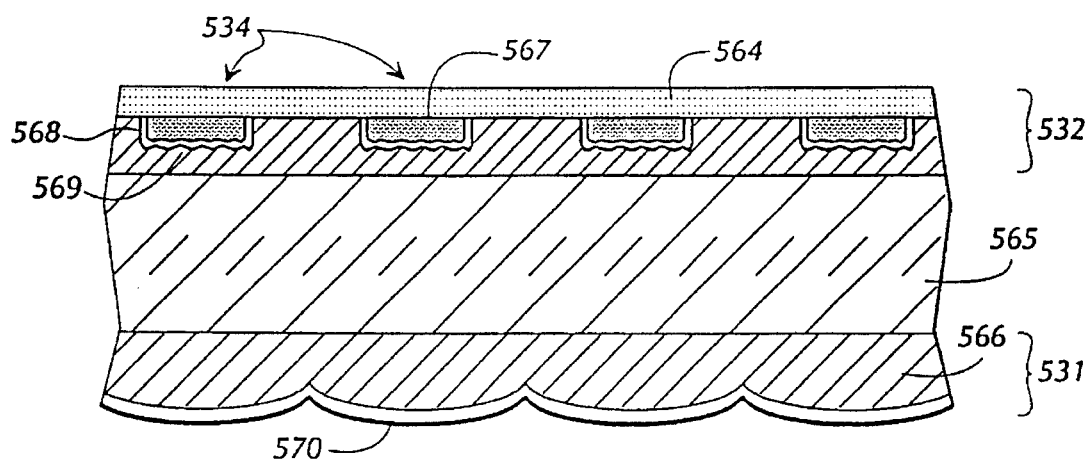
FIG. 10 is a cross-sectional view of yet another alternative embodiment of the present invention.

FIG. 10 shows another embodiment of the invention in which the relative positions of the focusing optics and light control optics are reversed. This embodiment also is formed using a transparent substrate 565. The light control optics 532, here used as the "outer optic", consists of zones 534 which appear dark from the outside of the structure but reflective from the inside of the structure, which zones are made by applying an opaque material 567 to a reflective substrate 568, such as aluminum. A diffractive pattern 569 may also be applied to the reflective substrate 568 to enhance the brightness of the image element 564. The dark zones of the light control outer optic consist of the transparent spaces between the reflective zones. The opaque material 567 prevents the reflective substrate regions 568 from reflecting light back to the observer without having first been reflected from the focusing optics 531. The focusing optics 531 are likewise used as the "inner optic" in this embodiment. The focusing elements are formed by embossing a photopolymer 566 to a transparent substrate 565 and coating the photopolymer surface with a reflective substrate 570. In this embodiment, the focusing optics 531 will function as focusing reflectors. The same photopolymer or other transparent embossing material 566 may be used to emboss the focusing optics 531 and the light control optics 532.

Figure 11:
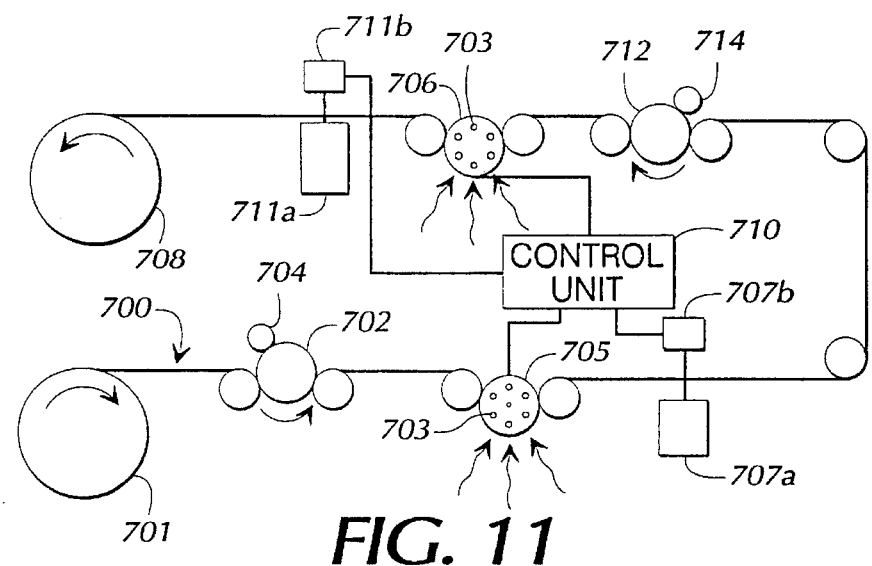
FIG. 11 shows a functional block diagram of the embossing system of the present invention.

FIG. 11 illustrates a block diagram of the embossing system used to emboss the focusing optics and the light control optics of FIGS. 4a–11 onto a film. Film Roll 701 is a roll of treated polyester or treated polypropyline which functions as the substrate upon which the inner and outer optics will be embossed. As the film 700 passes over the roller 702, the top surface of the film 700 is coated with a layer of liquid photopolymer. Roller 702 is preferably a Gravure roller which is a metal roller having a large number of very small pits etched into the surface. At the top of the roller there is a reservoir of liquid photopolymer (not shown). As the liquid photopolymer is applied to the surface of roller 702 from the reservoir, roller 704 scrapes the surface of roller 702 thereby allowing only the liquid photopolymer in the pits to remain on the roller. The excess liquid photopolymer is scraped away. This allows a metered amount of liquid photopolymer to be applied to the top surface of the film 700.

The film is then moved over embossing roller 705 which carries the master for the focusing optics. Rollers 705 and 706 are preferably thermosiphon chill rolls. A thermosiphon is an evacuated roller which is filled with a working fluid. The roller contains a large number of water cooling lines 703 which are located in close proximity to the surface of the roller. The working fluid is kept in contact with the surface of the roller through centrifugal force.

As heat is applied to the surface of the roller, the working fluid in contact therewith immediately evaporates. As the vapor comes into contact with the water cooling lines, it condenses and drips back down into the working fluid. This isothermal process allows large amounts of heat to be absorbed very uniformly while maintaining the entire surface of the roller at a constant temperature.

As the film moves over the embossing roller 705, the pattern of the focusing optics is formed in the liquid photopolymer. Once the pattern has been formed in the liquid photopolymer, ultraviolet light is applied to the film. This causes the photopolymer to harden and bond to the film. In general, during the hardening process the pattern formed in the photopolymer shrinks. By using the thermosiphon as the embossing roller, the photopolymer is maintained at a constant temperature. This reduces the possibility of local hot or cold spots in the photopolymer which result in nonuniformity in the scale of the pattern formed in the photopolymer. Once the focusing optic pattern has been formed, a laser scale detection unit 707a, b (described in detail below) is used to determine whether the scale of the outer optic embossment is correct.

The film with the focusing optics embossed thereon is then moved over a second Gravure roller 712. Gravure roller 712 in conjunction with roller 714 applies a metered amount of liquid photopolymer to the bottom surface of the film 700. The film is then moved over embossing roller 706 which carries the master for the inner optic. Once the inner optic pattern has been formed in the liquid photopolymer, ultraviolet light is applied to the film, thereby causing the photopolymer to harden and bond to the film.

The film having the inner and outer optic embossments formed thereon is then examined by a second laser scale detection unit 711a, b to determine whether the patterns are sufficiently close in scale. This information is then sent to the control unit 710. The control unit 710 receives information from the laser scale detection units and controls the temperatures of the thermosiphons 705 and 706 in accordance with this information. Therefore, the temperature of the thermosiphons 705 and 706 can be adjusted such that the scale of the inner optic embossment matches the scale of the outer optic embossment by means of thermal expansion and contraction of the embossing rollers 705 and 706.

Figure 12A:
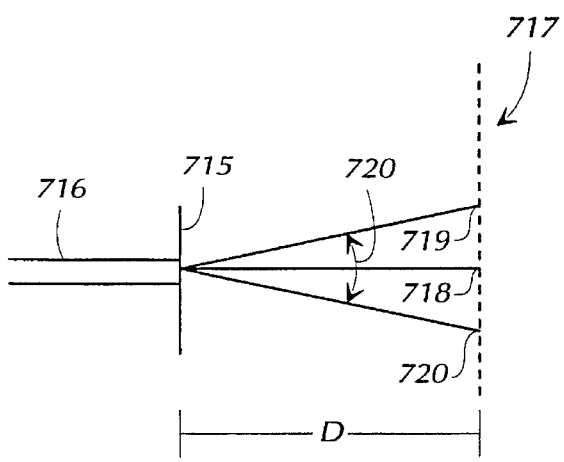
FIG. 12a illustrates the interference pattern utilized by the laser scale detection unit.

FIG. 12a illustrates how the laser scale detection unit determines the scale of the embossments. The width of laser beam 716 is typically on the order of 1 millimeter. The focusing elements of the focusing optic 715 are typically on the order of 24 microns. Therefore, the focusing optic is comprised of approximately 40 focusing elements per millimeter. Due to the extremely small size of the focusing elements with respect to the laser beam, the focusing optic behaves like a diffraction grating which causes an interference pattern 717 to be created. The interference pattern 717 forms an array of spots 718, 719 and 720. Spots 718, 719 and 720 represent the zero order out, the first order out, and the minus one order out, respectively. By monitoring the exact locations of the first order out and the minus one order out, any change in the scale or period of the focusing optic can be determined.

Figure 12B:
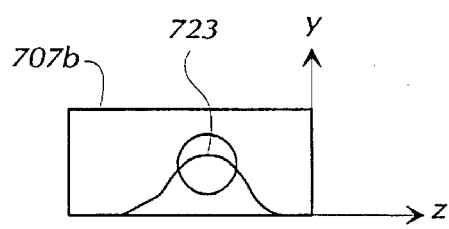
FIG. 12b is a functional block diagram of one of the detectors of the laser scale detection unit.

FIG. 12b illustrates a block diagram of one of the laser detectors used to monitor the exact locations of the first order out and the minus order out of the interference pattern. Laser beam 716 has a gaussian distribution 723. Detector 707b (located at the projection of the spot pattern 717) tracks the location of the centroid of the spots in two dimensions. The detector 707b has a high enough resolution to track the location of the centroid to within one tenth of a micron. The distance D between the focusing optic 715 and the detectors 707b, 711b is known and therefore, the angle 720 can be calculated by control unit 710 in accordance with the distance D and the coordinates of the centroids. Angle 720 is used to determine the scale of the focusing optics pattern. This information is then utilized by the control unit 710 to control the temperatures of thermosiphons 705 and 706 to create embossments of the desired scale.

Once the focusing optics and the light control optics have been embossed on the film, laser scale detection 707a, b and 711a, b is used to determine whether the structure is satisfactory, i.e., whether the scale of the focusing optics matches the scale of the light control optics. If the periods do not match, detector 707b and/or 711b will detect two centroids instead of one. The control unit 710 will then notify an operator that the light control embossment is defective. The control unit 710 will then adjust the temperatures of either or both of the thermosiphons 705 and 706 in accordance with the scale information. Also, if the embossments do not match in scale, a human observer viewing the structure will see moiré banding and thereby detect a defect. The observer can then adjust the temperatures of the thermosiphons 705 and 706 accordingly.

Preferably, the photopolymer used to create the inner and outer optic embossments is a blend consisting of Ebercryl 3700 40% trimethylolpropane triacrylate 40% isobornyl acrylate 17% and CIBA-GEIGY Irgacure 184 3%. This blend cures by means of ultraviolet light. Other types of radiation cured material can also be used for this purpose.

Figure 13A:
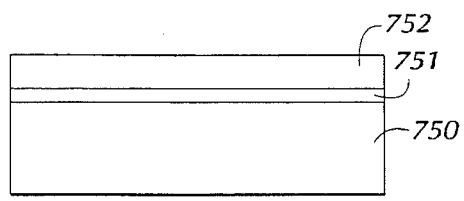
FIGS. 13a–13g illustrate a method for creating the master comprising light control optics and the focusing optics.
Figure 13B:
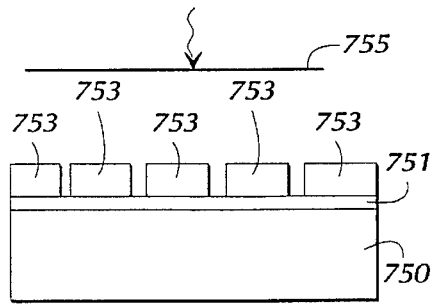
Figure 13C:
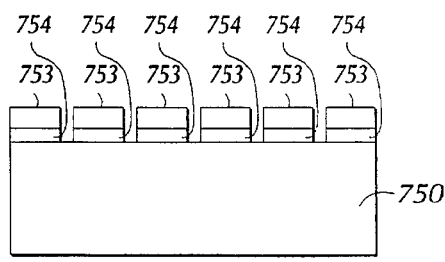
Figure 13D:
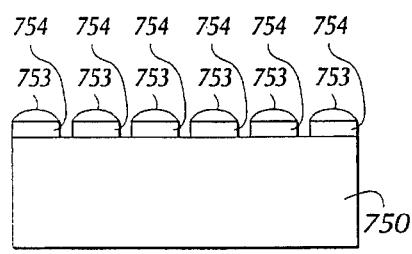
Figure 13E:
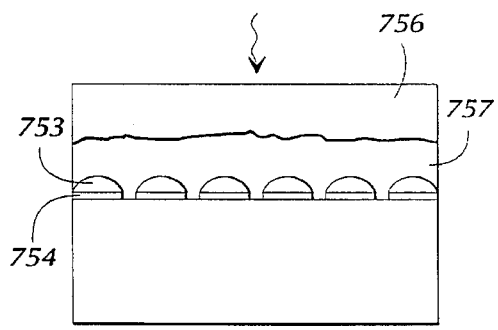
Figure 13F:
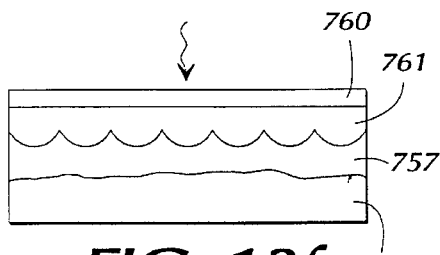

FIGS. 13a–13g illustrate a preferred embodiment of the present invention for fabricating the light direction control optics masters. As shown in FIG. 13a, a substrate 750 is covered with a layer of chrome 751. On top of the layer of chrome 751 is a layer of photoresist 752. A mask 755 is placed over the structure as shown in FIG. 13b. The structure is then exposed to ultraviolet light. Clear areas in mask 755 correspond to areas in the photoresist which will be exposed to the ultraviolet light and subsequently developed away. After the exposed areas are developed away, pads of photoresist 753 are left on top of the chrome layer 751. An acid bath (not shown) is then used to etch away the chrome in positions which are not covered by the photoresist pads 753. The result is the structure shown in FIG. 13c. The chrome pads 754 act as an adhesion promotor between the photoresist pads 753 and the substrate 750. Photoresist heat flowing is then used to cause the photoresist pads 753 to flow, thereby creating dome shapes on top of the chrome pads as shown in FIG. 13d. A glass substrate 756 is placed in contact with liquid photopolymer 757 which is in contact with the structure of FIG. 13d, as shown in FIG. 13e. The structure is then exposed to ultraviolet light which causes inverted dome shapes to be created in the photopolymer 757. The master is comprised of layers 756 and 757 shown in FIG. 13f. FIG. 13f also shows how an embossment can be made from the master. A substrate 760, preferably a plastic film such as polyester, is placed in contact with liquid photopolymer 761. This structure is then exposed to ultraviolet light thereby causing photopolymer 761 to harden. The master and the embossment are then separated and the result is the embossment 763 shown in FIG. 13g.

Figure 13G:
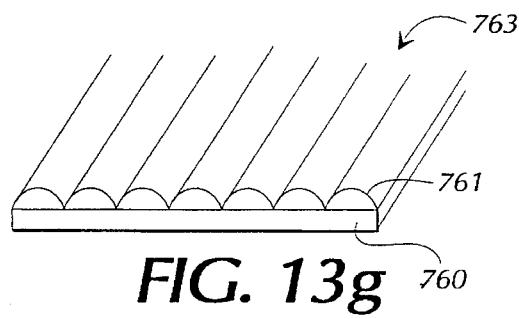
Figure 14A:
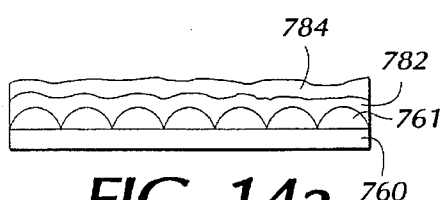
FIGS. 14a–14d illustrate a preferred embodiment for forming the dark zones in the light control optics master.
Figure 14B:
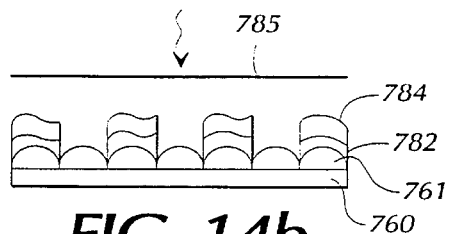

The method discussed above with respect to FIGS. 13a–13f is first used to produce the structure shown in FIG. 13g in which substrate 760 is preferably glass. FIG. 14a shows a front view of the structure of FIG. 13g. The structure 763 is coated with a thin layer of metal 782 which is preferably chrome. The layer of metal 782 is spin coated with a layer of photoresist 784. Photoresist layer 784 is then exposed to ultraviolet light through a mask 785, as shown in FIG. 14*b*. The exposed photoresist is then developed away leaving the metal layer 782 exposed at the locations where the photoresist has been removed. The chrome is then etched away by an acid bath thereby exposing the cured layer of photopolymer 761 as shown in FIG. 14*b*. The photopolymer layer 761 is then etched by reactive ion etching. Preferably, oxygen is used as the reactive gas. Due to impurities in the composition of the cured photopolymer 761, the dry etching process creates light traps in the form of stalagtite-shaped or tapered structures 787 in the photopolymer 761. The dimensions of the tapered structures are typically on the order of 0.5 µ to 4 µ in height and 0.1 µ to 2 µ in width. The high aspect ratios of the tapered structures cause light entering the light traps to be reflected at very shallow angles, thereby resulting in a great number of reflections within the light traps. Depending on the reflective characteristics of the light trap surface, approximately 40% of the light may be absorbed on initial impact and at each additional reflection. Therefore, very few reflections are required for the light to be absorbed. Virtually all of the light which enters the light trap will eventually be absorbed.

Figure 14C:
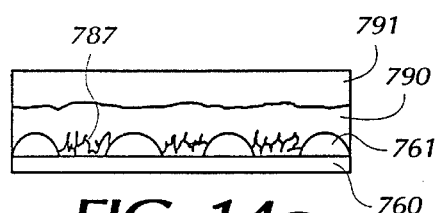

As shown in FIG. 14*c*, once the light traps 787 have been formed in the cured photopolymer layer 761, a layer of liquid photopolymer 790 is placed in contact with cured photopolymer layer 761. A transparent substrate 791 is placed in contact with the liquid photopolymer. The structure is then exposed to ultraviolet light (not shown) which hardens the liquid photopolymer 790. The hardened photopolymer 790 bonds with substrate 791. The substrate 791 and the hardened photopolymer 790 are then separated from the photopolymer layer 761 having the light traps 787 formed therein. The resulting master is shown in FIG. 15*d*. Alternatively, a metal embossing master may be formed from photopolymer layer 761 by conventional electroforming processes. For example, photopolymer layer 761 may be coated with a thin layer of metal, such as silver, by vapor deposition in order to render it electrically conductive. Electrical contact can then be made to the metal surface and a thick layer of nickel can be plated onto the surface by conventional electroforming processes. After deposition of a sufficient thickness of nickel, the nickel plated photopolymer layer 761 may be removed from the electroplating bath and the nickel master separated from photopolymer layer 761.

Figure 15A:
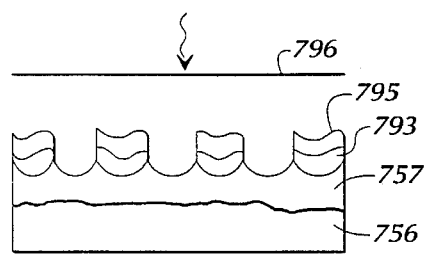
FIGS. 15a–15b illustrate an alternative embodiment for forming the dark zones in the light control optics master.
Figure 15B:
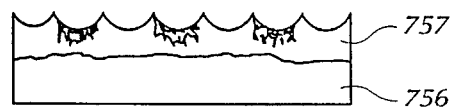

FIGS. 15*a* and 15*b* illustrate an alternative embodiment for creating light control optics master. A structure comprising substrate 756 and a cured photopolymer layer 757, such as the one shown in FIG. 13*f*, is covered with a thin layer of metal 793 such as chrome. Metal layer 793 is covered with a layer of photoresist 795. The photoresist is exposed to ultraviolet light through mask 796 and the exposed photoresist is developed away leaving certain areas of metal layer 793 exposed. The exposed areas of the metal are then etched away by using an acid bath. The resulting structure is shown in FIG. 15*a*. Reactive ion etching is then used to etch the light traps into the photopolymer in the same manner as described above with respect to FIG. 14*b*. FIG. 15*b* represents the resulting inner optic master.

Figure 16A:
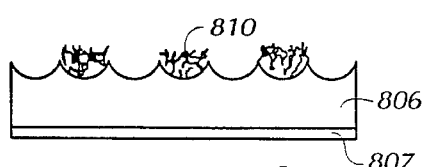
FIGS. 16a and 16b illustrate an alternative embodiment for creating the light control optics master.
Figure 16B:
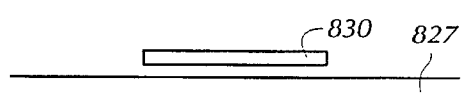
Figure 16B:

FIGS. 16*a* and 16*b* represent another alternative embodiment for generating the inner optic master. A master comprised of glass substrate 800 and a layer of cured photopolymer 801 having a light trap 802 formed throughout its entire surface is placed in contact with a layer of liquid photopolymer 805. The liquid photopolymer is also in contact with a cured layer of photopolymer 806 having inverted domed shapes formed therein. The structure is exposed to ultraviolet light through mask 808 which selectively cures photopolymer 810 in the regions exposed to ultraviolet light. The cured photopolymer 810 adheres to photopolymer 806 and remains with it when photopolymer 806 is separated from photopolymer 801. The residual uncured liquid photopolymer 805 remaining on photopolymer layer 806 may be removed by a solvent wash. The resulting inner light control optics master shown in FIG. 16*b* is comprised of substrate 807 and cured photopolymer layer 806 having the light traps 810 selectively formed therein.

Figure 14D:
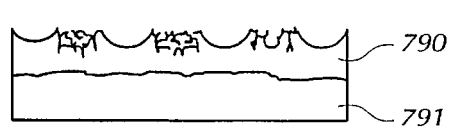

It should be apparent to those skilled in the art that other techniques may be used to create the light control optics master of the present invention. For example, conventional techniques, such as diamond turning, may be used to form domed shapes in a layer of photopolymer. Reactive ion etching may then be used to generate the fields of tapered elements which constitute the light traps. Once the light control optic master has been produced, embossments can be easily generated therefrom by the procedures discussed above with respect to FIGS. 13*f* and 13*g* and with respect to FIGS. 14*c* and 14*d*. If it is desirable to use dome-shaped bright zones in the light control optic, one of the structures shown in FIGS. 14*d*, 15*b* or 16*b* may be used as the light control optic master. If it is desirable to use inverted, or dish-shaped, bright zones in the light control optic, one of the structures shown in FIGS. 14*d*, 15*b* or 16*b* will constitute the light control optic embossments.

Figure 17:
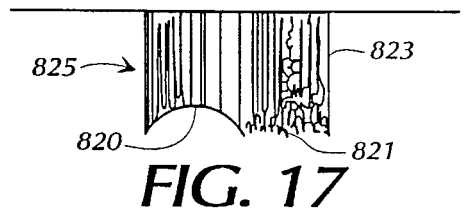
FIGS. 17 and 18 are cross-sectional views of preferred embodiments for the light control material of the present invention.

FIG. 17 illustrates a cross-sectional view of a preferred embodiment for displaying autostereoscopic or dynamic images in accordance with the present invention. Once the light control optic master has been produced, the light direction control optics and the focusing optics are formed in a layer of photopolymer by the method discussed below with respect to FIGS. 22*a*–22*d*. The light direction control optics are comprised of a pattern of bright zones 820 and dark zones 821. The photopolymer layer has holes 823 pierced through it which generally are less than one quarter of a wavelength of light in diameter. Piercing holes through the photopolymer layer alters the index of refraction of the photopolymer by replacing portions of the photopolymer with air. The photopolymer layer typically has an index of refraction of 1.52. Air has an index of refraction of 1.00. Therefore, the index of refraction of the photopolymer can be graded by selectively piercing it with a large number of holes in certain areas and a small number of holes in other areas and by making the change in the number of holes throughout the photopolymer layer gradual. By creating this gradient refractive index throughout the photopolymer layer the light focusing characteristics of the photopolymer can be selectively altered. In essence, the gradient refractive index areas formed in the photopolymer layer accomplish the same function as the focusing optics, or lenses, described above with respect to FIGS. 3*a*–10.

One advantage to incorporating the light direction control function of the inner optic and the light focusing control function of the outer optic into a single layer of photopolymer is that one master can be created which contains the inner optic pattern and the gradient refractive index hole pattern and embossments can be generated therefrom. This substantially eliminates problems with temperature and scale control requirements which are generally necessary to insure that the scale of the light direction control optics and the scale of the focusing optics are correct. A further advantage to incorporating the light direction and light focusing control functions into a single layer of material is that the light can be controlled very precisely.

The structure of FIG. 17 essentially produces the same effect as the structures described above with respect to FIGS. 3a–10. The photopolymer layer 825 (hereinafter referred to as the light control optics), which contains the pattern of bright zones and dark zones and the hole pattern, is embossed onto a transparent substrate 827 which is preferably polyester. Generally, the interleaved image elements 830 may be located anywhere between the light control optics 825 and the observer (not shown). In fact, the interleaved image elements may be located directly on the upper surface of the light control optics 825. Preferably, the interleaved image elements are located on the surface of substrate 827, which provides mechanical stability to the light control material. The period of the bright zones 820 and the dark zones 821 is constant over each image element but changes from one image element to the next in the manner described above with respect to FIGS. 3a–3c. The light control optics will preferably operate in a reflective mode. However, the light control optics may just as easily be designed to operate in a transmissive mode if a separate light source (not shown) is used to illuminate the image elements through the light control optics 825. When the light control optics are operating in a reflective mode, the under surface of the single embossment is coated with a reflective layer of metal, preferably aluminum. When the light control optics are operating in a transmissive mode, only the dark zones will be coated with the reflective metal.

Figure 18:
Figure 18:
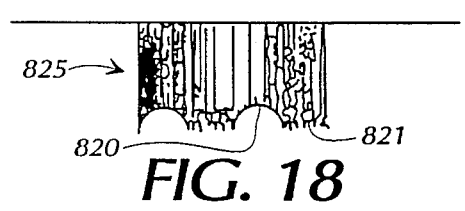

FIG. 18 illustrates a cross-sectional view of the structure of FIG. 17 wherein the light control optics 825 have multiple bright zones 820 under each gradient refractive index lens. The bright zones 820 are separated by dark zones 821. By providing multiple bright zones for each gradient refractive index lens, the field of view can be altered in the same manner and with the same advantages described above with respect to FIGS. 3b and 3c. The period of the bright zones 820 and dark zones 821 is constant over each image element but changes from one image element to the next. The structures of FIGS. 17 and 18 show only one image element and one period of the light control optics merely for ease of illustration. These structures will operate with as few as two sets of image elements (e.g., left and right) or with many more than that.

FIG. 19 illustrates the general concept of the gradient refractive index lenses of the present invention. A gradient refractive index lens 845 has a non-uniform index of refraction. For a converging lens, the material comprising the center of the lens has a high index of refraction and the material comprising the outer edges of the lens has a low index of refraction. Light 841 impinging on the surface of the lens 845 moves faster in the material having the low index of refraction and slower in the material having a high index of refraction thereby causing the light to bend toward the high index of refraction material. Therefore, the light tends to focus toward the center of the lens at focal point 847.

FIGS. 20a and 20b illustrate a known technique for altering the refractive index of a material. A glass cylinder 850 is placed in a chemical bath containing a chemical which will diffuse into the surface of the glass cylinder. Typically, the chemical bath will consist of a hot molten salt. The salt will either migrate into the glass or leach materials out of the glass thereby changing the chemical composition of the glass and consequently, the index of refraction of the glass. The chemical composition of the glass cylinder 850 will be changed the most toward the outer edges of the cylinder. As shown in FIG. 20b, the index of refraction decreases as the distance from the center of the cylinder R increases.

FIG. 21a illustrates a cross-sectional view of one of the gradient refractive index lenses of the present invention wherein the center of the structure 851 has a high index of refraction and the outer edges of the structure have low indices of refraction. The graph of FIG. 21a shows the index of refraction 853 being constant except in the altered areas of the structure. At the outer edges of the altered areas of the material, the index of refraction is low and increases toward the center of the altered area of the material.

Figure 21B:
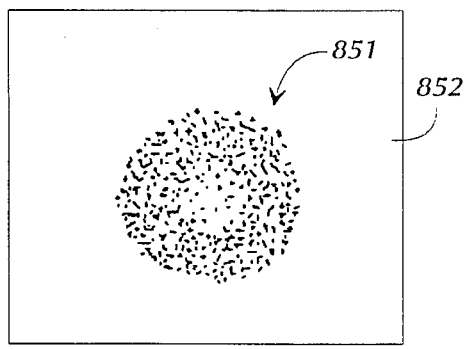
FIG. 21b is a plan view of the gradient refractive index lens of the present invention.

FIG. 21b illustrates a plan view of the structure 852 comprising an altered area of the material 851. The material is preferably altered by piercing holes through it. The holes are generally less than one quarter of a wavelength of light in diameter. Since the hole diameters are small in comparison to the wavelength of light, light impinging on the structure sees the structure as having a bulk property, i.e., the light will not distinguish the individual holes. In the areas of the material where the number of holes is greatest, the index of refraction will be low in comparison to areas of the material having a lesser number of holes. As shown in FIG. 21b, the density of holes increases with distance from the center of the material. Therefore, the outer edges of the material will have a low index of refraction in comparison to the center of the material. This means that light impinging on structure 852 from a direction normal to the plan view shown in FIG. 21b will move faster through the outer, low refractive index areas than in the inner, high refractive index areas, thereby causing the light to focus along a line normal to the surface of structure 852 and passing through the center of the structure.

The method for creating the master for the light control optics 825 of FIGS. 17 and 18 will now be described in detail with reference to FIGS. 22a–22d. First, the pattern of bright zones 820 and dark zones 821 is obtained in a layer of cured photopolymer by, for example, generating an embossment from one of the masters shown in FIG. 14d, 15b or 16b. Once the cured photopolymer having the bright zones and dark zones formed therein has been obtained, additional steps are taken to form the gradient refractive index lenses in the cured photopolymer.

Figure 22A:
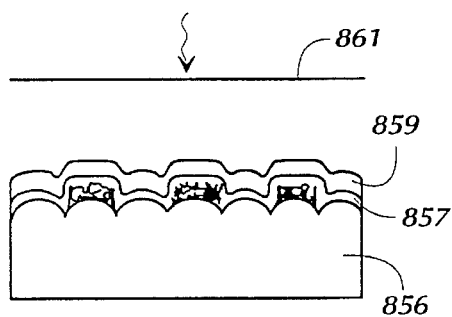
FIGS. 22a–22d illustrate a preferred embodiment for fabricating the single embossment autostereoscopic device of the present invention.
Figure 22B:
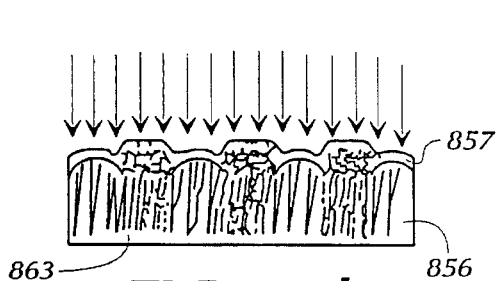

FIG. 22a illustrates a cross-sectional view of a light control optics embossment comprised of a layer of cured photopolymer 856 having bright zones and dark zones formed therein. The structure is covered with a thin layer of metal 857 preferably chrome, which is preferably deposited by vapor deposition. A layer of photoresist 859 is spin coated over the layer of chrome. A mask 861 comprised of clear and opaque areas masks certain areas of the photoresist layer during exposure to ultraviolet light. X-rays may also be used to expose the photoresist. The mask is generally a chrome-on-quartz mask. The opaque areas correspond to the chrome spots. Preferably, a positive photoresist is used. After exposure, the exposed areas of the photoresist are developed away leaving holes (not shown) in the photoresist layer 859. The chrome layer 857 is then etched with a chemical etch wherever there are holes in the photoresist layer 859. Thus, holes are created in the chrome layer 857 in areas which correspond to the clear areas in the mask 861. Ion beam milling is then used to etch holes 863 down into the layer of cured photopolymer 856 which extend below the holes formed in the layer of metal, as shown in FIG. 22b. By using ion beam milling, a 10-to-1 etch rate differential may be realized between the chrome and the photopolymer. This allows long, thin holes 863 to be etched into the photopolymer 856. Once the holes have been etched in the photopolymer 856, the remainders of the photoresist and chrome layers are removed.

Figure 22C:
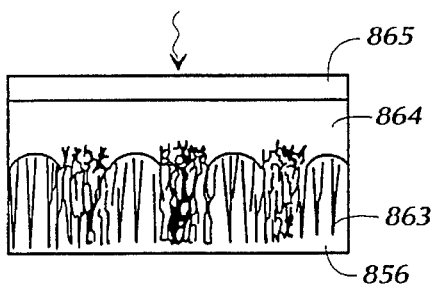

The photopolymer 856 having the holes 863 formed therein may then be placed in contact with a layer of liquid photopolymer 864 as shown in FIG. 22c. The liquid photopolymer is also in contact with a substrate 865, which is preferably quartz.

Figure 22D:
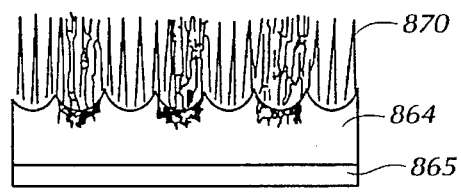

The structure is exposed to ultraviolet light which causes the liquid photopolymer to harden and bond to substrate 865. The hardened photopolymer 864 and substrate 865 are separated from the photopolymer layer 856. The resulting structure, shown in FIG. 22d, is a master of the light control optics from which embossments can be produced. The master is comprised of cured photopolymer 864, which has posts 870 formed thereon, and substrate 865. In a preferred embodiment, a nickel electroform of the master is created prior to generating an embossment by directly depositing a conductive layer of metal all over the surface of the master and electroforming nickel from that conductive surface.

A suitable method for depositing the conductive metal layer is by sputtering. Sputtering is preferred over evaporative coating because sputtering tends to coat undercuts and recesses whereas evaporation tends to shadow those areas.

To create the light control optics embossment, a liquid photopolymer and substrate (not shown) are placed in contact with the metal master and the entire structure is exposed to ultraviolet light. The cured photopolymer and substrate are then separated from the master thereby forming a light control optics embossment which is generally the same as either of the devices shown in FIGS. 17 and 18.

As an alternative to creating an embossment by placing liquid photopolymer in contact with a master and exposing it to ultraviolet light, extrusion embossing may be used to generate an embossment. Extrusion embossing requires that a transparent molten extrudate be placed in contact with the master and cooled until it solidifies. In accordance with the present invention, the transparent molten extrudate is preferably polyester. The transparent molten extrudate is placed in contact with a substrate. The substrate and extrudate are then placed in proximity to a master such that the extrudate is in contact with the master. The extrudate is then cooled until it solidifies whereby the pattern formed in the master is transferred to the extrudate. The substrate and hardened extrudate which constitute the embossment are then separated from the master.

Figure 23:
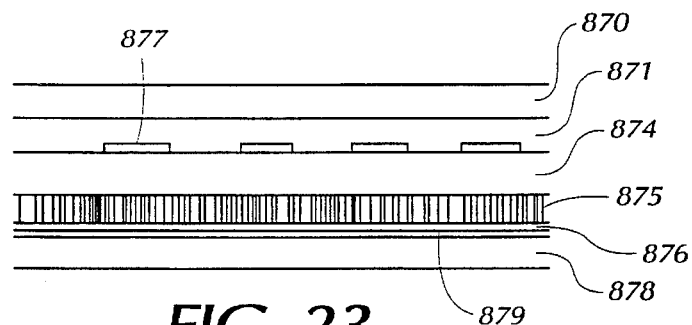
FIGS. 23 illustrates one possible use of the light control material of the present invention.

One advantage to creating the light control optics as a single embossment as shown in FIGS. 17 and 18 is that the surfaces of the light control optics and the substrate 827 are flat and either may be easily prepared to accept ink. FIG. 23 illustrates an example of one of many possible uses of the light control material of the present invention. The light control material comprising the light control optics 875 and transparent substrate 874 may be incorporated as an integral part of a potato chip bag. The potato chip bag may be comprised of an outer layer of plastic 870, an adhesive layer 871, the light control material of the present invention, a layer of aluminum 876 which will normally be used to coat the back surface of the light control optics 875 to enhance reflectivity, a second adhesive layer 879, and an inner layer of plastic 878.

Interleaved print dots 877 may be printed directly on the top surface of substrate 874. Since the print is normally carried on a substrate in conventional potato chip bags, a conventional printing process may be used when manufacturing a bag which incorporates the light control material of the present invention. The primary difference is that in the present invention, multiple print images must be interleaved. The process of actually printing the image on the substrate is essentially the same as the printing processes currently being used for this purpose with the exception that the printing plates carry interleaved image strips or print dots.

Figure 24:
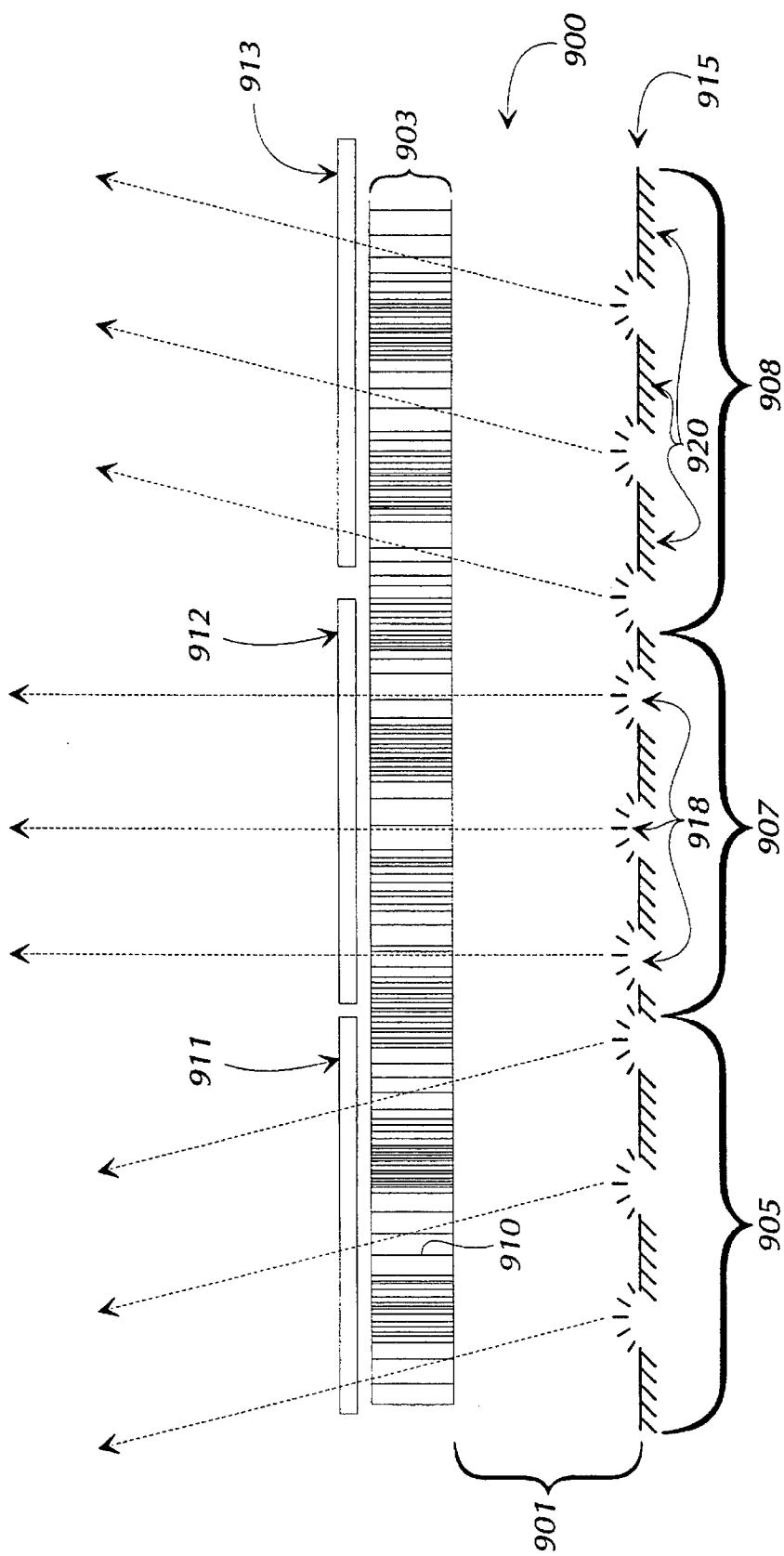
FIG. 24 is a cross-sectional view of an alternative embodiment of the present invention.

FIG. 24 shows an alternative embodiment of the present invention wherein the outer optic is comprised of a gradient refractive index lens. The structure of FIG. 24 operates in the same manner as the structure described above with reference to FIG. 3a. In this embodiment, the outer optic 903 is comprised of gradient refractive index lenses which have been embossed from a master fabricated in accordance with the above-described methods. However, unlike the embodiments of FIGS. 17 and 18, in the embodiments of FIG. 24, the pattern of bright and dark zones 918 and 920 is separated from the refractive index lenses 903 by a transparent substrate 901. The refractive index lenses provide the same function as the focusing optics of FIG. 3a.

The light control material 900 is a two-layer optical system wherein the layers are separated by a transparent substrate 901. The outer optic 903 is comprised of a layer of photopolymer having gradient refractive index lenses formed therein. Preferably, the gradient refractive index lenses are converging lenses which have been formed by piercing holes through the photopolymer, as discussed above with respect to FIGS. 22a–22d. Alternatively, the outer optic can be created by any known method for creating gradient refractive index lenses. The inner optic 915, which is comprised of bright zones 918 and dark zones 920, may operate in a light transmissive or reflective mode. The dark zones 920 may be either light absorbing or light dispersing. Preferably, the inner optic pattern is comprised of the brightness enhancer structures and light traps discussed above with respect to FIGS. 3b, 3c, 17 and 18. Since the light control material 900 operates in the same manner as the light control material discussed above with respect to FIGS. 3a–3c, any further discussion of the light control material 900 would be redundant and therefore will be omitted.

While the invention has been disclosed in preferred forms, it will be apparent to those skilled in the art that many modifications can be made to the invention without departing from the spirit and scope of the invention as set forth in the appended claims.

We claim:

1. A light control material for displaying autostereoscopic or dynamic images, said light control material comprising:
    light direction control optics comprised of a pattern of bright zones and dark zones, said bright zones and dark zones providing light direction control, said light direction control optics formed in a polymer layer; and
    light focusing optics also formed in said polymer layer, said light focusing optics comprised of gradient refractive index lenses, said gradient refractive index lenses providing light focusing control and wherein said light direction control optics and said light focusing optics cooperate to direct light through all of the gradient refractive index lenses associated with a particular image element in one particular direction such that an autostereoscopic or dynamic image is provided.

2. A light control material for displaying autostereoscopic or dynamic images according to claim 1 wherein a transparent substrate is bonded to said polymer layer.

3. A light control material for displaying autostereoscopic or dynamic images according to claim 2 wherein said dark zones disperse light.

4. A light control material for displaying autostereoscopic or dynamic images according to claim 2 wherein said dark zones absorb light.

5. A light control material for displaying autostereoscopic or dynamic images according to claim 4 wherein said dark zones are light traps comprised of tapered structures, wherein said stalagtite-type structures cause light entering said light traps to be reflected within said light traps until virtually all of the light has been absorbed by said light traps, and wherein said light traps are coated on at least one side with a reflective metal.

6. A light control material for displaying autostereoscopic or dynamic images according to claim 2 wherein said bright zones operate in a light transmissive mode.

7. A light control material for displaying autostereoscopic or dynamic images according to claim 2 wherein said bright zones operate in a reflective mode and wherein said bright zones are coated on at least one side with a reflective metal.

8. A light control material for displaying autostereoscopic or dynamic images according to claim 2 wherein said bright zones are dome-shaped structures.

9. A light control material for displaying autostereoscopic or dynamic images according to claim 2 wherein there are a plurality of said bright zones for each of said gradient refractive index lenses and wherein each of said bright zones is separated by at least one of said dark zones.

10. A light control material for displaying autostereoscopic or dynamic images according to claim 2 wherein said transparent substrate is comprised of polyester.

11. A light control material for displaying autostereoscopic or dynamic images according to claim 5 wherein said bright zones operate in a light transmissive mode.

12. A light control material for displaying autostereoscopic or dynamic images according to claim 5 wherein said bright zones operate in a reflective mode and wherein said bright zones are coated on at least one side with a reflective layer of metal.

13. A light control material for displaying autostereoscopic or dynamic images according to claim 5 wherein there are a plurality of said bright zones for each of said gradient refractive index lenses and wherein each of said bright zones is separated by at least one of said dark zones.

14. A light control material for displaying autostereoscopic or dynamic images, said light control material comprising:

light control optics which provide light direction control and light focusing control, wherein said light control optics are formed in a single polymer layer, said light direction control provided by a pattern of dark zones and bright zones, wherein said bright zones are arcuate-shaped structures and wherein said dark zones are light traps comprised of tapered structures, said light traps coated on one side with a reflective layer of metal, said light focusing control provided by a plurality of gradient refractive index lenses formed throughout said light control optics, wherein said gradient refractive index lenses are formed by piercing holes into said single polymer layer and wherein said holes pass through said pattern of dark zones and bright zones.

15. A light control material for displaying autostereoscopic or dynamic images according to claim 14 wherein said bright zones are coated on at least one side with a reflective layer of metal and wherein said bright zones operate in a reflective mode.

16. A light control material for displaying autostereoscopic or dynamic images according to claim 14 wherein said bright zones operate in a light transmissive mode.

17. A light control material for displaying autostereoscopic or dynamic images according to claim 14 wherein there are a plurality of said bright zones for each of said gradient refractive index lenses and wherein each of said bright zones is separated by at least one of said dark zones.

18. A light control material for displaying autostereoscopic or dynamic images according to claim 14 wherein a transparent polyester substrate is bonded to said light control optics.

19. A light control material for displaying autostereoscopic or dynamic images, said light control material comprising:

light direction control optics comprised of a pattern of bright zones and dark zones, said bright zones and dark zones formed in a first polymer layer, said bright zones and dark zones providing light direction control;

a transparent substrate having a first side bonded to said first polymer layer; and light focusing optics comprised of gradient refractive index lenses, said gradient refractive index lenses formed in a second polymer layer, said second polymer layer bonded to a second side of said transparent substrate, said transparent substrate separating said light direction control optics from said light focusing optics by a predetermined distance, said plurality of gradient refractive index lenses providing light focusing control and wherein said light direction control optics and said light focusing control optics cooperate to direct light through all of the gradient refractive index lenses associated with a particular image element in one particular direction such that an autostereoscopic or dynamic image is provided.

20. A light control material for displaying autostereoscopic or dynamic images according to claim 19 wherein there are a plurality of said bright zones for each of said gradient refractive index lenses and wherein said bright zones are separated by at least one of said dark zones.

21. A light control material for displaying autostereoscopic or dynamic images according to claim 19 wherein said dark zones disperse light.

22. A light control material for displaying autostereoscopic or dynamic images according to claim 19 wherein said dark zones absorb light.

23. A light control material for displaying autostereoscopic or dynamic images according to claim 22 wherein said dark zones are light traps comprised of tapered structures having high aspect ratios, wherein said tapered structures cause light entering said light traps to be reflected within said light traps until virtually all of the light has been absorbed by said light traps, and wherein said light traps are coated on at least one side with a reflective layer of metal.

24. A light control material for displaying autostereoscopic or dynamic images according to claim 19 wherein said bright zones operate in a light transmissive mode.

25. A light control material for displaying autostereoscopic or dynamic images according to claim 19 wherein said bright zones operate in a reflective mode and wherein said bright zones are coated on at least one side with a reflective layer of metal.

26. A light control material for displaying autostereoscopic or dynamic images according to claim 19 wherein said bright zones are arcuate-shaped structures.

27. A light control material for displaying autostereoscopic or dynamic images according to claim 19 wherein said transparent substrate is comprised of polyester.

* * * * *